US 6,625,766 B1

(12) United States Patent
Oh et al.

(10) Patent No.: US 6,625,766 B1
(45) Date of Patent: Sep. 23, 2003

(54) TESTER OF SEMICONDUCTOR MEMORY DEVICE AND TEST METHOD THEREOF

(75) Inventors: Se-Jang Oh, Anyang (KR); Ki-Sang Kang, Suwon (KR)

(73) Assignee: Samsung Electronics Co, Ltd., Suwon (KR)

( * ) Notice: Subject to any disclaimer, the term of this patent is extended or adjusted under 35 U.S.C. 154(b) by 0 days.

(21) Appl. No.: 09/512,158

(22) Filed: Feb. 24, 2000

(30) Foreign Application Priority Data

Feb. 24, 1999 (KR) .......................................... 1999-6088

(51) Int. Cl.⁷ ........................ G11C 29/00; G06F 11/263
(52) U.S. Cl. ...................... 714/719; 714/710; 714/711; 714/723
(58) Field of Search ................ 714/710–711, 718–720, 714/722–723, 758, 786; 340/146.2; 326/54

(56) References Cited

U.S. PATENT DOCUMENTS

| | | | | |
|---|---|---|---|---|
| 4,061,908 A | * | 12/1977 | De Jonge et al. | 714/720 |
| 4,669,082 A | * | 5/1987 | Tilghman et al. | 714/718 |
| 4,896,133 A | * | 1/1990 | Methvin et al. | 340/146.2 |
| 5,325,367 A | * | 6/1994 | Dekker et al. | 714/718 |
| 5,630,160 A | * | 5/1997 | Simpson et al. | 340/146.2 |
| 5,739,745 A | * | 4/1998 | Simpson | 340/146.2 |
| 6,137,188 A | * | 10/2000 | Mitchell et al. | 326/54 |
| 6,351,833 B1 | * | 2/2002 | Nomura | 714/718 |

* cited by examiner

Primary Examiner—R. Stephen Dildine
(74) Attorney, Agent, or Firm—Marger Johnson & McCollom, P.C.

(57) ABSTRACT

A test method of a tester of a semiconductor memory device which includes recording a test pattern into the semiconductor memory device, reading the recorded test pattern to compare with a expected pattern, detecting information on a defect of the semiconductor memory device with a result of the comparison and interpreting the information on the defect of the semiconductor memory device, the method comprising the steps of: setting up minimum and maximum values relevant to a desired capacity of the semiconductor memory device to be tested; counting up from the preset minimum to the preset maximum values; generating a carry signal by comparing the preset maximum value with the counted value when the counted value gets to the preset maximum value; and resetting a value to be counted if the carry signal is generated, to thereby generate addresses of the semiconductor memory device, and a tester of the semiconductor memory device comprising: minimum and maximum address registering means for saving minimum and maximum address values relevant to a desired capacity of the semiconductor memory device to be tested; address counting means for increasingly counting from the minimum value to generate addresses; and carry signal generating means for generating carry signals, if the addresses output from the address counting means and a signal output from the maximum address registering means are the same, to thereby reset the address counting means, so that a user of the tester does not have to make a new test program, providing convenience in performing a test and improving reliability in results of the test.

15 Claims, 7 Drawing Sheets

TESTER OF SEMICONDUCTOR MEMORY DEVICE AND TEST METHOD THEREOF

BACKGROUND OF THE INVENTION

The present invention relates to a tester of a semiconductor memory device and a test method thereof, and more particularly to a tester of a semiconductor memory device and a test method thereof, in case of testing the semiconductor memory device having memory cells whose memory capacity does not increase by $2^n$, by which a user can perform a test without changing a test program of the tester.

A conventional tester of a semiconductor memory device (hereinafter referred to as semiconductor memory device) generates addresses to test the semiconductor memory device whose capacity regularly increases by $2^n$. In case that the tester performs a test to the semiconductor memory device whose capacity does not regularly increase by $2^n$, in other words, if the capacity of the memory cells is $2^n + \alpha$, which is in the range of $2^n$ to $2^{n+1}$, a counter which generates read, write and refresh addresses can not count up to $2^n + \alpha$. Only if the counter counts up to $2^{n+1}$ can all the memory cells of the semiconductor memory device be tested. This is because only a single, "prime" bit within a field of bits of a maximum address value is detected, which prime bit represents an address of a $2^n$ magnitude, where n is an integer.

In order to test the semiconductor memory device whose capacity does not increase by $2^n$, the user of the tester should make a new test program, which takes a great deal of time and effort. However, the reliability of the semiconductor memory device to be tested by the new test program may not be so satisfactory.

SUMMARY OF THE INVENTION

It is an object of the present invention to provide a test method of a semiconductor memory device for precisely generating a desired magnitude of addresses without making a new test program in case the capacity of future semiconductor memory devices does not regularly increase by $2^n$.

It is another object of the present invention to provide a tester of the semiconductor memory device to accomplish the aforementioned object.

In order to accomplish the aforementioned object of the present invention, there is provided a test method of a tester of a semiconductor memory device which records a test pattern into the semiconductor memory device, reads the recorded test pattern to compare with a desired value pattern, detects information on a defect of the semiconductor memory device resulting from the comparison and interprets the information on the defect of the semiconductor memory device, the method comprising the steps of:

setting up minimum and maximum values relevant to a desired capacity of the semiconductor memory device to be tested;

counting up from the preset minimum value;

generating a carry signal, by comparing the preset maximum value with the counted value when the count gets to the preset maximum value. Preferably, the method further comprises thereafter resetting a value to be counted if the carry signal is generated, to thereby generate further test addresses of the semiconductor memory device.

In order to accomplish another object of the present invention, there is provided a tester of the semiconductor memory device which records a test pattern into the semiconductor memory device, reads the recorded test pattern to compare with a desired value pattern, detects information on a defect of the semiconductor memory device resulting from the comparison and interprets the information on the defect of the semiconductor memory device, the tester comprising:

minimum and maximum address registering means for saving minimum and maximum address values relevant to a desired capacity of the semiconductor memory device to be tested;

address counting means for increasingly counting from the minimum value to generate addresses; and carry signal generating means for generating carry signals, if addresses output from the address counting means and a signal output from the maximum address registering means are the same, to thereby reset the address counting means.

DETAILED DESCRIPTION OF THE INVENTION

Before a tester and a test method of a semiconductor memory device are described in accordance with the present invention, a conventional tester of the semiconductor memory device will be described with references to accompanying drawings.

Figure 1:
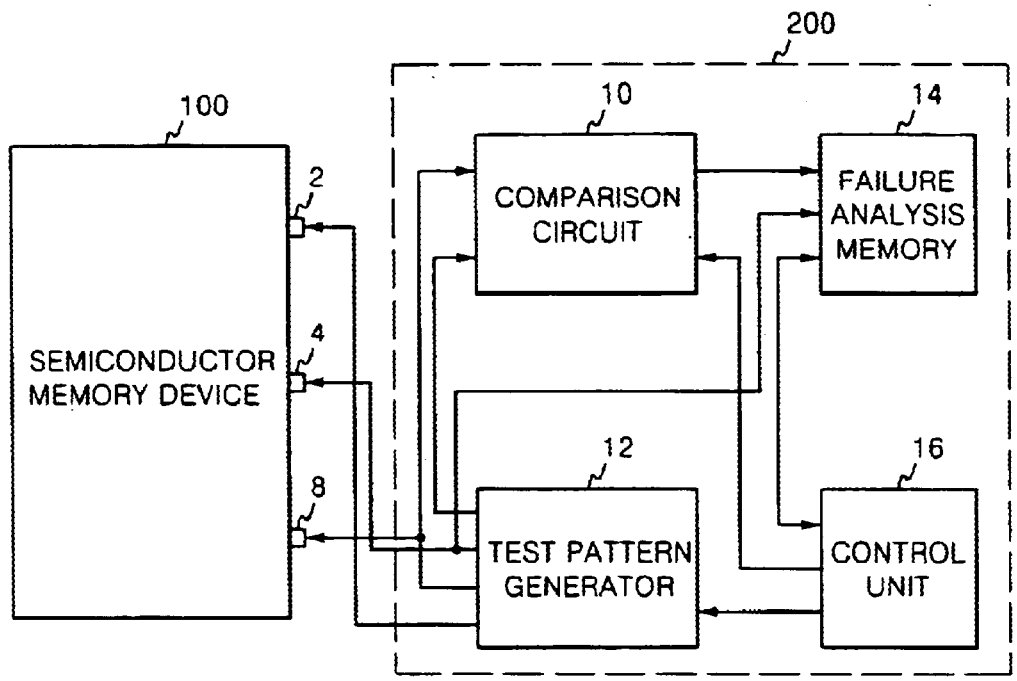
FIG. 1 is a block diagram for illustrating a conventional tester of a semiconductor memory device.

FIG. 1 is a block diagram for illustrating a conventional tester of a semiconductor memory device 100, the tester 200 including a comparison circuit 10, a test pattern generator 12, a failure analysis memory 14 and a control unit 16. The memory device 100 includes input/output terminals 2, 4, 8 for writing and reading test patterns by tester 200 at addresses therein.

Functions of the aforementioned parts will be described below.

The test pattern generator 12 generates a test pattern to be recorded in the semiconductor memory device 100, an address to designate a position of the recorded pattern and a control signal. In addition, it also outputs a desired value pattern to the comparison circuit 10. The comparison circuit 10 compares the test pattern output from the semiconductor memory device 100 and the desired value pattern output from the test pattern generator 12. Whenever the comparison circuit 10 detects nonconformity of the two patterns, the information on the defect is recorded at a relevant address of the failure analysis memory 14, which memorizes the information on the position of the defect cell.

In testing the semiconductor memory device 100, an address is designated under the control of the control unit 16 and the test pattern output from the test pattern generator 12 is recorded at the semiconductor memory device 100. The test pattern read from the semiconductor memory device 100 is applied to the comparison circuit 10 along with the desired value pattern output from the test pattern generator 12. If a defect is detected due to nonconformity of the two patterns, the information on the defect is recorded at the related address of the failure analysis memory 14. After the information on the defect is recorded, the information on the defect of the semiconductor memory device 100 is read and output from the failure analysis memory 14 to the control unit 16, which performs interpretation on the defect of the semiconductor memory device 100.

Figure 2:
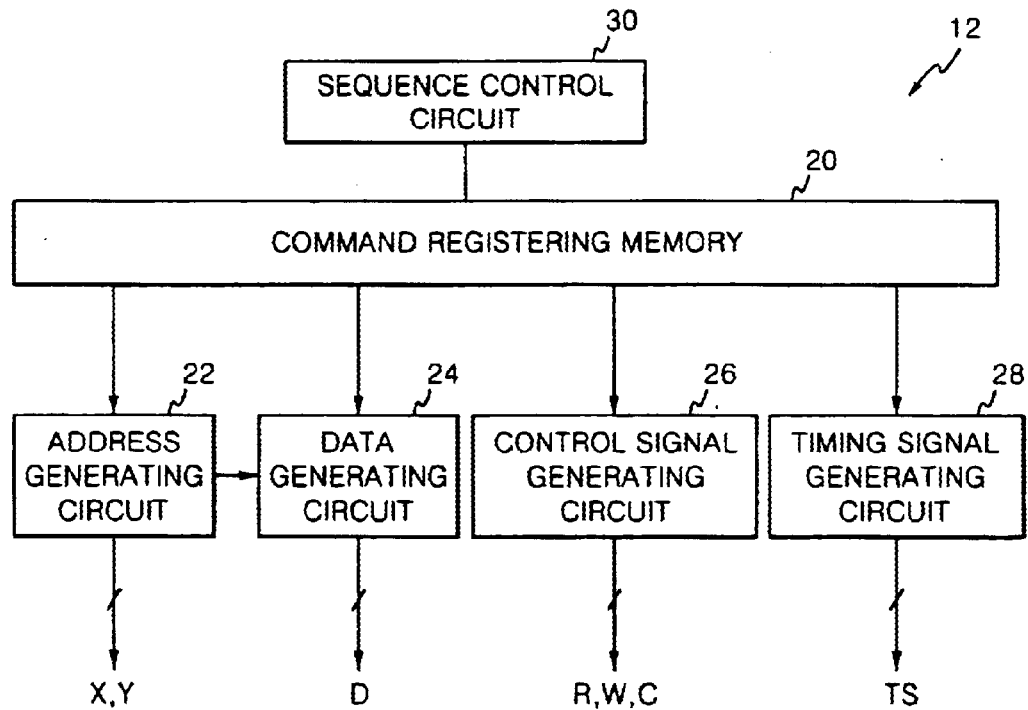
FIG. 2 is a block diagram for illustrating a test pattern generator shown in FIG. 1.

FIG. 2 is a block diagram for illustrating the structure of a test pattern generator 12 shown in FIG. 1, comprising a command registering memory 20, an address generating circuit 22, a data generating circuit 24, a control signal generating circuit 26, a timing signal generating circuit 28 and a sequence control circuit 30.

The functions of the parts thus constructed will be described below.

A command registering memory 20 generates control signals for controlling all the generating circuits such as address generating circuit 22, data generating circuit 24, control signal generating circuit 26 and timing signal generating circuit 28. The address generating circuit 22 generates an address X, Y in response to a control signal generated by the command registering memory 20. The data generating circuit 24 outputs data D relevant to the address generated by the address generating circuit 22 in response to control signal generated by the command registering memory 20. The control signal generating circuit 26 generates read R, write W, and control C signals in response to a control signal generated by the command registering memory 20. The timing signal generating circuit 28 generates a timing signal TS in response to the control signal generated by the command registering memory 20. The sequence control circuit 30 outputs a control signal by controlling the command registering memory 20 in response to the control signal generated by the control unit 16 (see FIG. 1).

Figure 3:
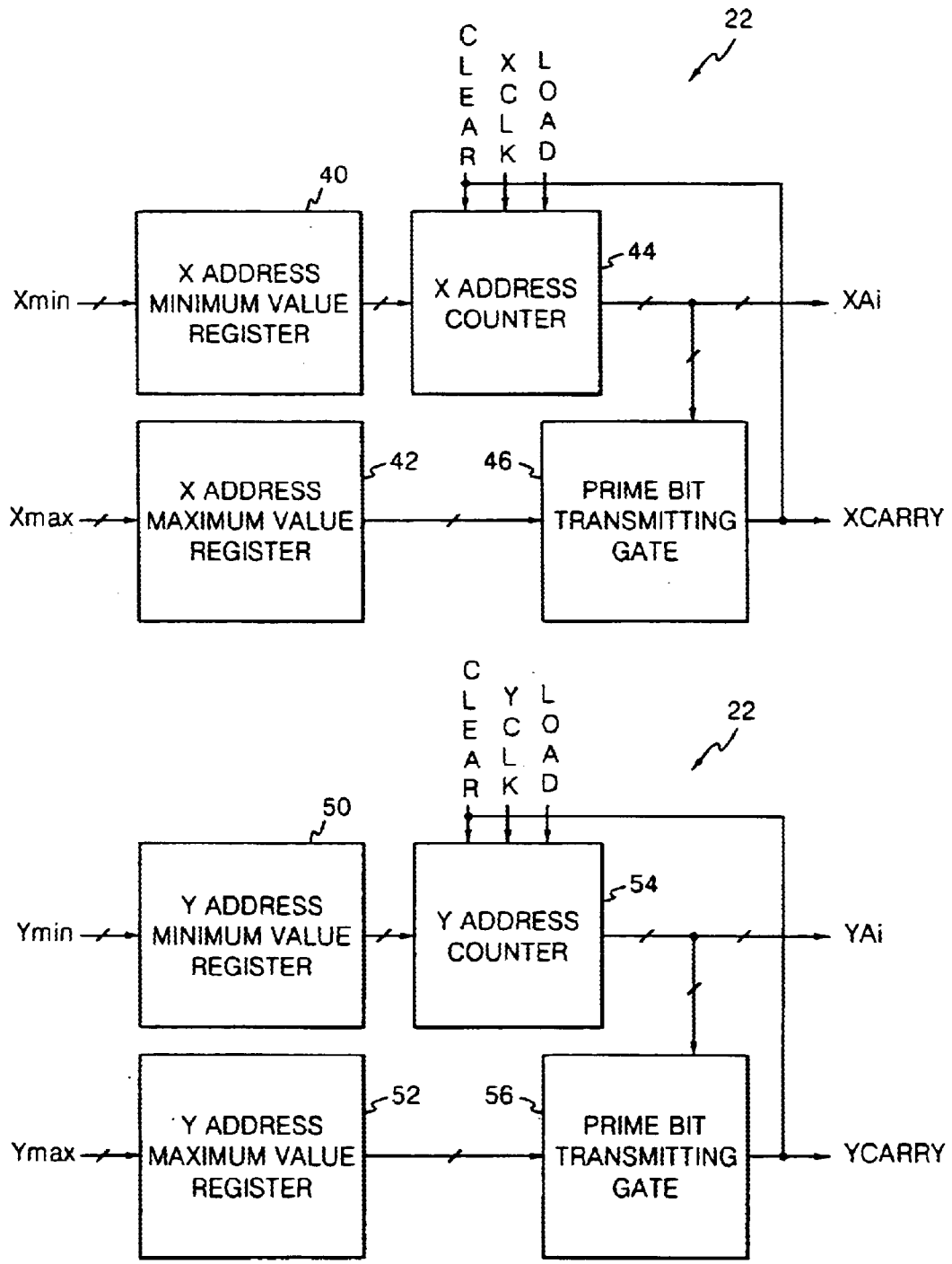
FIG. 3 is a block diagram for illustrating an address generating circuit of the conventional tester of the semiconductor memory device.

FIG. 3 is a block diagram of the structure of the conventional address generating circuit 22, with the upper and lower portions of FIG. 3 relating to X and Y, respectively. Address generating circuit 22 comprises X,Y address minimum value registers 40, 50; X, Y address maximum value registers 42, 52; X, Y address counters 44, 54; and prime bit transmitting gates 46, 56.

Functions of the parts thus constructed will be described below.

The X, Y address minimum value registers 40, 50 respectively save minimum values of X, Y addresses, Xmin, Ymin. The X, Y address maximum value registers 42, 52 respectively save maximum values of the X, Y addresses, Xmax, Ymax. Those minimum and maximum values, Xmin, Ymin, Xmax, Ymax, are set up by a test program. The X address counter 44 inputs a minimum value, Xmin, saved at the register 40 in response to a load signal and reset or cleared in response to a clear signal to generate an X address of i bits, XAi. The Y address counter 54 inputs a minimum value, Ymin, saved at the register 50 in response to a load signal and reset or cleared in response to a clear signal to generate a Y address of i bits, YAi. The prime bit transmitting gate 46 processes a signal output from the X counter 44 to generate an XCARRY signal in response to a prime bit signal saved at the register 42 and resets or clears the X address counter 44. The prime bit transmitting gate 56 processes a signal output from the Y counter 54 to generate a YCARRY signal in response to a prime bit signal saved at the register 42 and resets the Y counter 54.

If the maximum value of X and Y addresses of the semiconductor memory device to be tested at the X, Y address maximum registers 42, 52 is 1080, the maximum registers 42, 52 are programmed to save 2048, not 1080. Therefore, "(MSB) 100000000000 (LSB)" is saved at the maximum registers 42, 52. When the X,Y address counters 44, 54 reach a count of 2048, the prime bit transmitting gates 46, 56 respectively generate X, Y carry signals, XCARRY, YCARRY. Accordingly, the conventional tester 200 via the conventional address generator 22 assumes maximum X and Y addresses are $2^n$ (and decodes, via prime bit transmitting gates 46, 56, only a single positional bit of address) assuming only one to be of any importance, rather than utilizing the contents of the entire address field for delimiting the address ranges.

Figure 4:
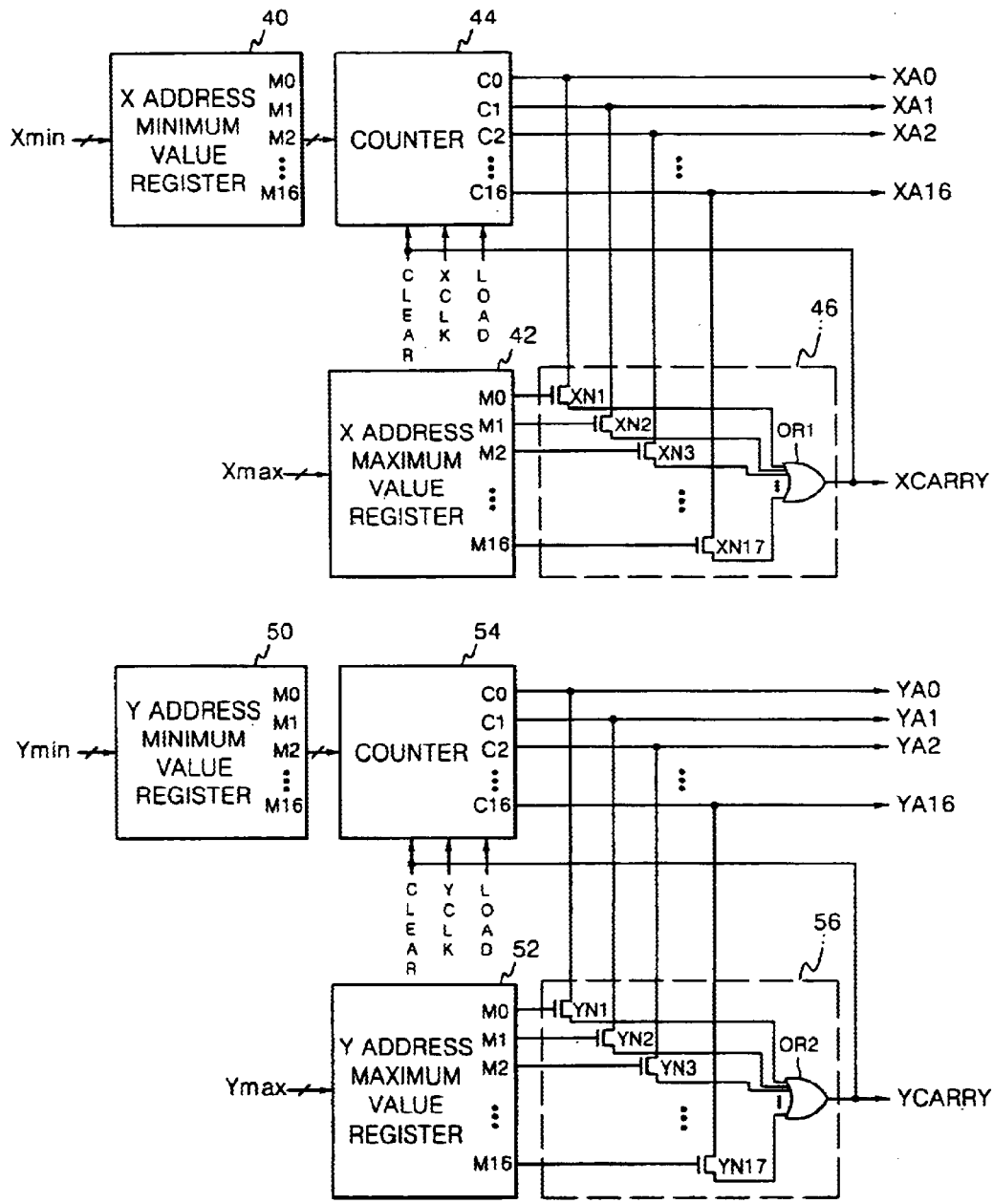
FIG. 4 is a circuit diagram for illustrating an embodiment of an address generating circuit shown in FIG. 3.

FIG. 4 is a circuit diagram of an embodiment of the address generating circuit shown in FIG. 3, showing the structure of the address generating circuit for generating 17 bits of X, Y addresses. The upper and lower portions of FIG. 4 relate to X and Y, respectively.

In FIG. 4, the registers 40, 42, 50, 52 and the X, Y address counters 44, 54 have 17 bits. The prime bit transmitting gate 46 includes NMOS transmitting gates XN1, XN2, ... XN17 which turn on in response to the signal output from the X address maximum value register 42 for respectively transmitting 17 bit data output from the counter 44 by bit and an OR gate OR1 for generating an X carry signal XCARRY by ORing the signals output from the NMOS transmitting gates.

The prime bit transmitting gate 56 includes NMOS transmitting gates YN1, YN2, ... YN17 which turn on in response to the signal output from the Y address maximum value register 52 for respectively transmitting 17 bit data output from the counter 54 by bit and an OR gate OR2 for generating a Y carry signal YCARRY by ORing the signals output from the NMOS transmitting gates.

Functions of the parts thus constructed will be described below.

First of all, minimum and maximum values of X, Y addresses, Xmin, Ymin, Xmax, Ymax, preset by the test program are saved at registers 40, 42, 50, 52. When a load signal LOAD is applied, the counters 44, 54 respectively save minimum values at minimum value registers 40, 50.

If a test were performed to the semiconductor memory device having the maximum value of the X and Y addresses set at 1080 according to an X scanning method, minimum and maximum values, Xmin, Ymin, Xmax, Ymax, would respectively be set to 0 and 2048 by a test program, in accordance with conventional test methods and testers. If the maximum values, Xmax, Ymax, were set at 1080 instead of 2048, for which the decode logic within prime bit transmitting gates 46, 56 is structured, then the X and Y carry signals, XCARRY, YCARRY, cannot be accurately generated.

If the test is performed according to the X scanning method, the counter 44 increases by one in response to a clock signal XCLK and the counter 54 maintains at its minimum value Ymin. The counter 44 increasingly counts up to 1023 in response to the clock signal XCLK. Also, if the counter 44 reaches 1024, a logic 1 is transmitted by the NMOS transistor N11 (not shown) kept at the on state in response to a signal output from the register 42, and the OR gate OR1 produces a logic 1 on the X carry signal XCARRY at the output of the OR gate OR1. If the carry signal XCARRY is a logic 1, i.e. if XCARRY is generated, the counter 44 is reset or cleared to generate a clock signal YCLK for increasing Y addresses.

Then, the Y address counter 54 increments or increasingly counts Y addresses by one, while the X address counter 44 increments or increasingly counts X addresses in response to the X clock signal, XCLK. For each Y address X is scanned from minimum Xmin to maximum Xmax through the X addresses. Then the Y address is increased again, and the range of X address scanning is repeated.

So, addresses are generated to the semiconductor memory device to be tested according to the X scanning method by repeating the aforementioned operations.

On the other hand, if addresses are generated according to a Y scanning method, addresses are generated by increasing Y addresses while the X address is fixed. In other words, the Y address counter 54 increasingly counts Y addresses up to the maximum value Ymax in response to the clock signal YCLK. Each time the Y carry signal YCARRY is generated, the X address is incremented once in response to a clock signal XCLK. Addresses are generated to the semiconductor memory device to be tested according to the Y scanning method by repeating the aforementioned operations.

The conventional tester of the semiconductor memory device has prime bit transmitting gates 46, 56 constructed for transmitting only the prime bit. Therefore, if the capacity of the semiconductor memory device to be tested is $(2^n+\alpha) \times (2^n+\beta)$, the maximum X and Y values are set to $2^{n+1}$ to enable the X and Y counters to count al the way up to $2^{n+1}$, so as to be able to test the semiconductor memory device whose capacity is $(2^n+\alpha) \times (2^n+\beta)$.

Figure 5:
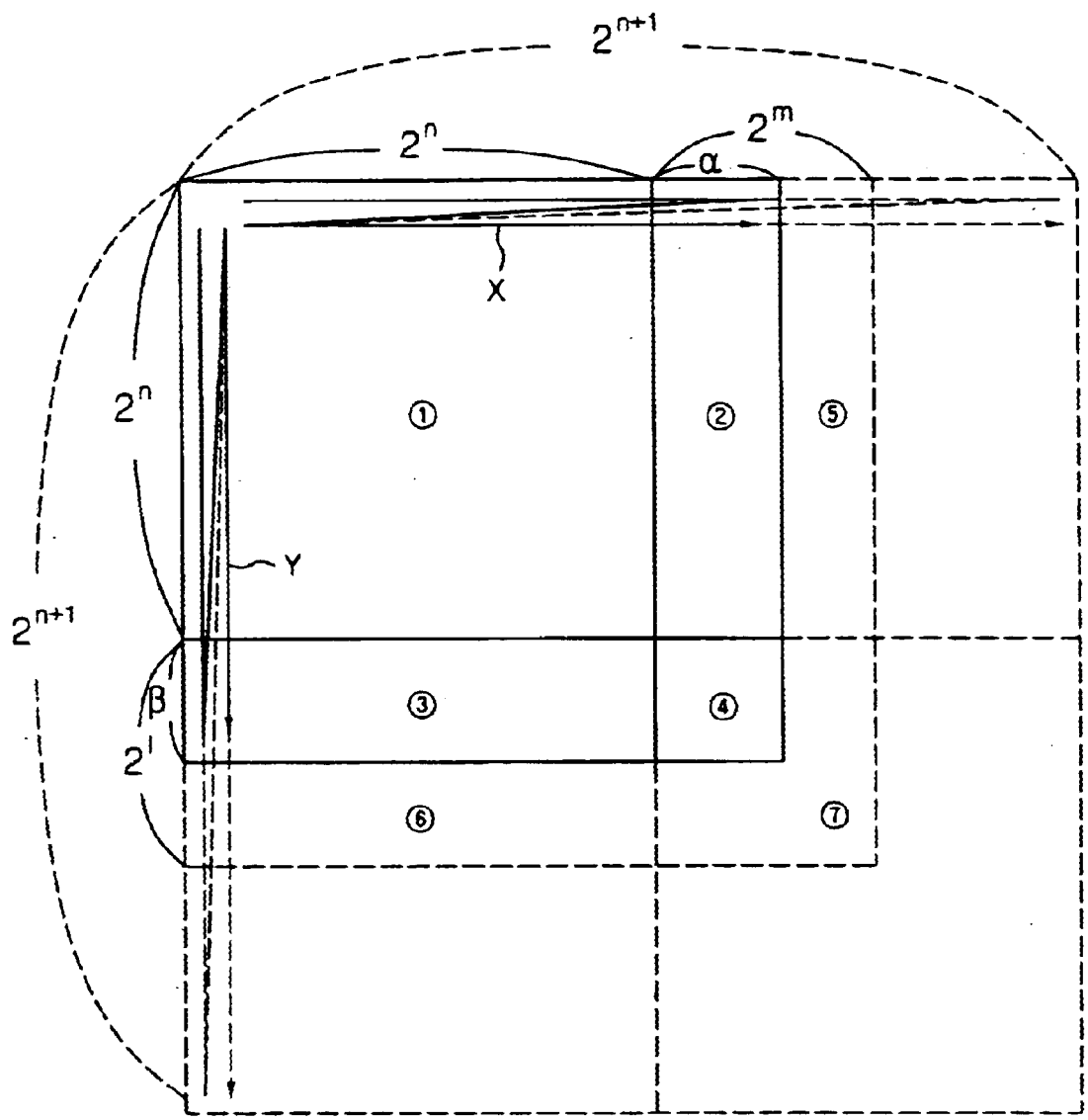
FIG. 5 is a diagram for illustrating memory blocks to describe an address generating method of the conventional tester of the semiconductor memory device.

Accordingly, there has been a problem in testing the semiconductor memory device whose capacity is $(2^n+\alpha) \times (2^n+\beta)$, in that the conventional address generating circuit generates addresses up to $2^{n+1} \times 2^{n+1}$ as indicated by dotted lines in FIG. 5, rather than up to the actual, smaller device capacity $(2^n+\alpha, 2^n+\beta)$ indicated by the solid lines embracing regions 1, 2, 3, 4.

In FIG. 5, the arrows respectively marked toward X and Y directions respectively generate addresses according to X and Y scanning methods.

Notwithstanding the aforementioned test methods, a main cell array block ① in FIG. 5 and spare cell array blocks ②, ③, ④ in FIG. 5 may be separately tested.

However, in this case, if the capacity of spare cell array blocks is not regular, then in order to test the spare cell array block ② in FIG. 5, for example, the minimum and maximum value addresses for generating addresses to both spare cell array blocks ②, ⑤ in FIG. 5 must be expressly designated by the test program. In order to test the spare cell array block ③ in FIG. 5, the minimum and maximum value addresses for generating addresses to both spare cell array blocks ③, ⑥ in FIG. 5 must be specifically designated by the test program. In order to test the spare cell array block ④ in FIG. 5, the minimum and maximum value addresses for generating addresses to both spare cell array blocks ④, ⑦ must be specifically designated by the test program.

For example, in case of testing spare cell array block ② in FIG. 5, an address relevant to its capacity, $2^m \times 2^n$, rather than $2^n + \alpha$, must be designated. That is, if the value of $\alpha$ is 156, $2^n$ is designated for the minimum value, and $2^n+(2^m-1)$, rather than $2^n+155$, is designated for the maximum value.

The conventional tester of the semiconductor memory device is constructed to generate a carry signal when the counter outputs the maximum value representing a regular capacity of the memory device, i.e. a power of 2 or $2^n$ X, Y addresses for the maximum value. In other words, the counter counts up to the maximum value by incrementing addresses and by using $2^n$ as the maximum value.

Therefore, the conventional tester of the semiconductor memory device is constructed to generate a range of addresses whose magnitude is $2^n$, where n is a positive integer. It is the structure of the prior art prime bit transmitting gates 46, 56—which assumes that only one ("prime") bit in the bit field representing the maximum address value completely defines the maximum value of an address—that leads to this significant prior art limitation.

Figure 6:
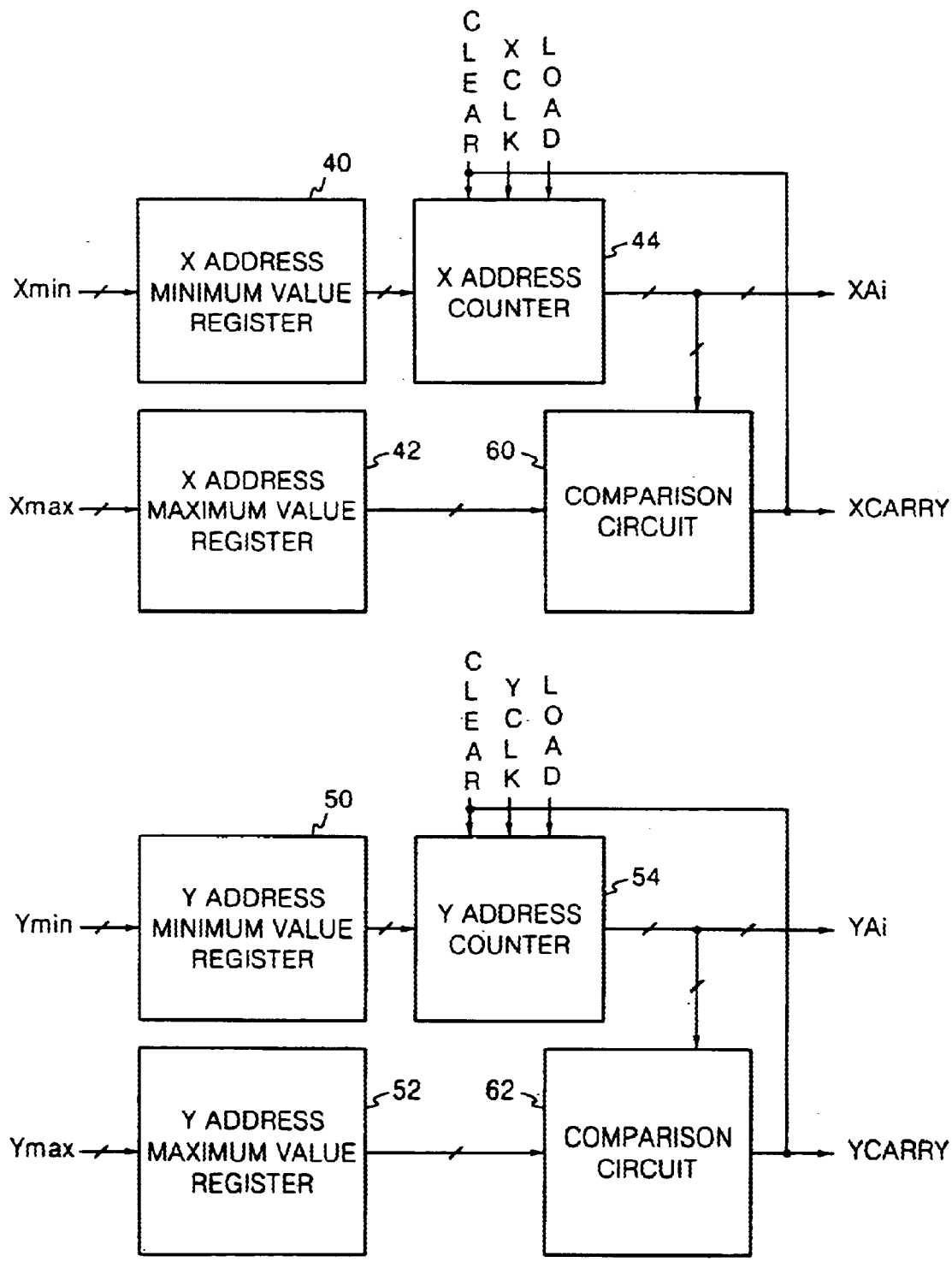
FIG. 6 is a block diagram for illustrating an address generating circuit of a tester of a semiconductor memory device in accordance with the present invention.

FIG. 6 is a block diagram for illustrating an embodiment of an address generating circuit of a tester of the semiconductor memory device of the present invention, comprising X, Y address minimum value generating circuits 40, 50; X, Y address maximum value generating circuits 42, 52; X, Y address counters 44, 54; and comparison circuits 60, 62.

Therefore, one important difference of the invention over the conventional testing is that the prime bit transmitting gates 46, 56 of the conventional address generating circuit shown in FIG. 3 are replaced in accordance with the invention by comparison circuits 60, 62 in the address generating circuit shown in FIG. 6.

Operations of the address generating circuit at the tester of the semiconductor memory device thus constructed will be described below.

First of all, minimum values, Xmin, Ymin, of X, Y addresses set by the test program are respectively saved at the X, Y address minimum value registers 40, 50, while maximum values, Xmax, Ymax, are respectively saved at the X, Y address maximum value registers 42, 52. The maximum values saved at the maximum value registers 42, 52 respectively become the maximum values of X, Y addresses relevant to the capacity of the semiconductor memory device. For instance, if the maximum values of X, Y addresses of the semiconductor memory device are respectively $2^n+\alpha$ and $2^n+\beta$, then $(2^n+\alpha)-1$ and $(2^n+\beta)-1$ are respectively saved at the maximum registers 42, 52.

The X, Y address counters 44, 54 input a minimum value in response to a load signal, reset or clear in response to a clear signal and increasingly count in response to clock signals XCLK, YCLK starting from the minimum value. When the X, Y address counters 44, 54 reach their maximum values, Xmax, Ymax, of X, Y addresses, the comparison circuits 60, 62 respectively generate X, Y carry signals, XCARRY, YCARRY, which reset or clear the X, Y address counters 44, 54.

Therefore, the address generating circuit of the tester of the semiconductor memory device of the present invention saves at the maximum value registers 42, 52 one less than the maximum values; generates X, Y carry signals XCARRY, YCARRY when the X, Y address counters 44, 54 count up to the preset maximum addresses minus one; and then resets or clears the counters 44, 54.

Addresses in accordance with the invention can be generated according to the aforementioned X, Y or other scanning methods. Those of skill in the art, however, will appreciate that the scanning in X and Y continues only through the designated address range, which may have a maximum that is not a power of two, e.g. Xmax or Ymax or both may not be $2^n$.

Therefore, even if the capacity of the semiconductor memory device to be tested is irregular, the address generating circuit of the conventional tester of the semiconductor memory device of the present invention can perform a test by counting addresses relevant to the device's irregular capacity, i.e. an X or Y capacity Xmax, Ymax that is not a power of 2.

Figure 7:
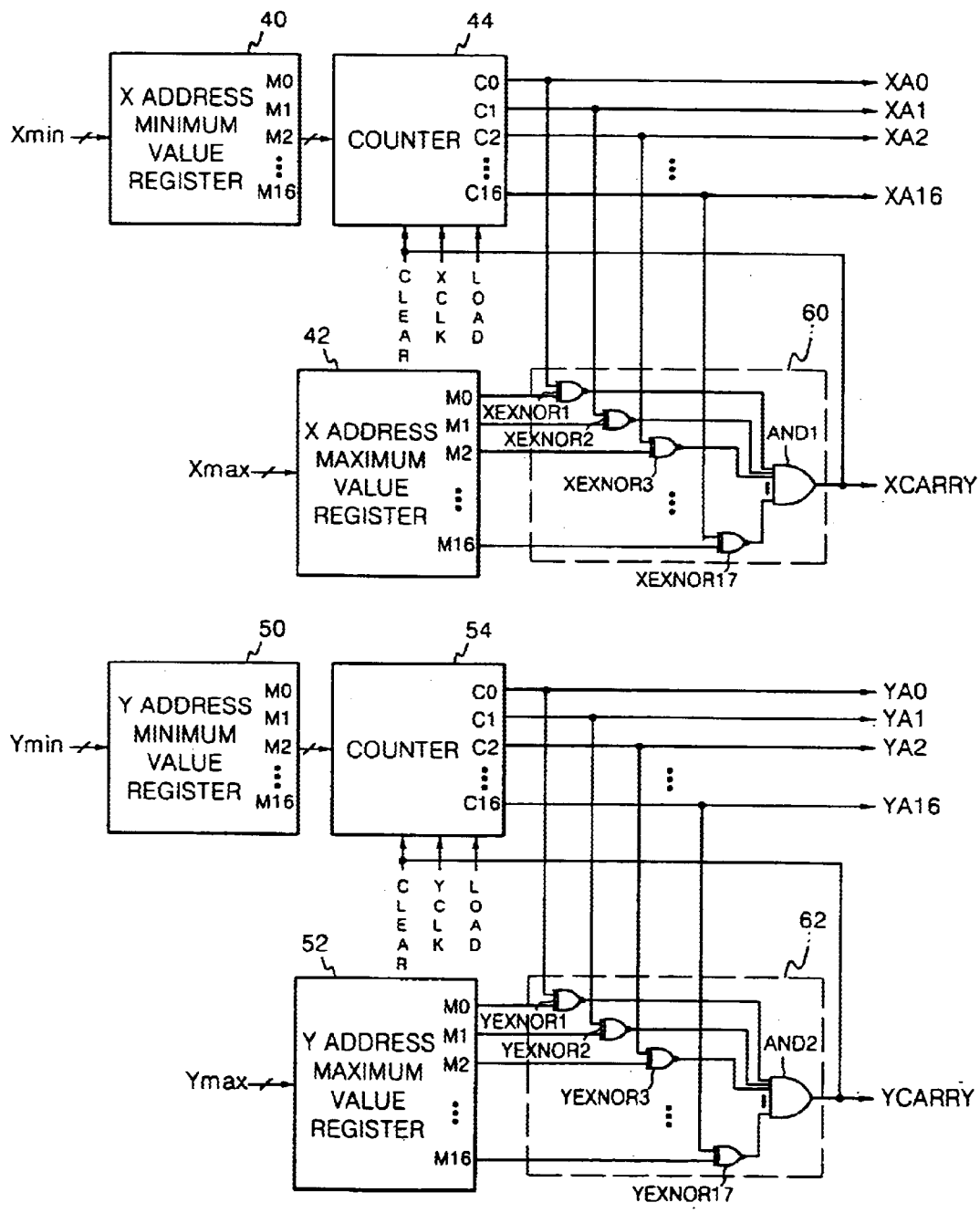
FIG. 7 is a circuit diagram for illustrating an embodiment of the address generating circuit shown in FIG. 6.

FIG. 7 is a circuit diagram for illustrating an embodiment of the address generating circuit shown in FIG. 6, being constructed to 16 bits of X, Y addresses.

In FIG. 7, registers 40, 42, 50, 52 are made of 17 bits of registers, and X, Y address counters 44, 54 are also made of 17 bits of counters.

The comparison circuit 60 includes XEXNOR gates, XEXNOR1, XEXNOR 2, . . . , XEXNOR17, for exclusive NORing and inverting the respective bit data output from the X counter 44 and the X address maximum value register 42 and an AND gate AND1 for ANDing the signals output from the XEXNOR gates.

The comparison circuit 62 includes YEXNOR gates, YEXNOR1, YEXNOR2, . . . , YEXNOR17, for exclusive NORing and inverting the respective bit data output from the Y counter 54 and the Y address maximum value register 52 and an AND gate AND2 for ANDing the signals output from the YEXNOR gates.

Operations of the address generating circuit at the tester of the semiconductor memory device thus constructed will be described below.

First of all, the minimum and maximum values, Xmin, Ymin, Xmax, Ymax, preset according to a test program are respectively saved at the registers 40, 50, 42, 52. When a load signal LOAD is applied, the X, Y counters 44, 54 respectively save the minimum values from the X, Y minimum value registers 40, 50.

If a test is performed to the semiconductor memory device having the maximum values of the X, Y addresses preset at 1080 according to an X scanning method, minimum and maximum values, Xmin, Ymin and Xmax, Ymax, are respectively set up at 0 and 1079 by a test program.

If the test is performed according to the X scanning method, the X counter 44 increments by one in response to a clock signal XCLK, while the Y counter 54 maintains at its minimum value, Ymin. The counter 44 increasingly counts up to 1078 in response to the clock signal XCLK. Also, when the counter 44 gets up to 1079, all the signals output from the XEXNOR gates, XEXNOR1, XEXNOR2, . . . , XEXNOR17, become logic 1. At this time, the AND gate AND1 produces a logic 1 XCARRY output. When the X carry out signal is generated, i.e. when XCARRY is a logic 1, the counter 44 is reset to generate a clock signal YCLK for increasing Y addresses.

Then, the Y address counter 54 increments the Y addresses by one, and the X address counter 44 scans through the X addresses until Xmax is reached. Then Y is incremented and X addresses are scanned again.

When the Y address counter 54 counts up to the actual maximum value by repeating the aforementioned operations, the comparison circuit 62 generates a Y carry out signal YCARRY of logic 1, which enables the addresses to make an access to all the memory cells.

In case that addresses are generated according to the Y scanning method, addresses are generated by increasing Y addresses while the X address is fixed. In other words, the Y address counter 54 increasingly counts Y addresses up to the maximum value Ymax, 1079, in response to the clock signal YCLK. When a Y carry signal YCARRY is generated, X addresses are increasingly counted in response to a clock signal XCLK. The aforementioned operations are repeated until the X address counter 40 reaches the maximum value Xmax, 1079.

Figure 8:
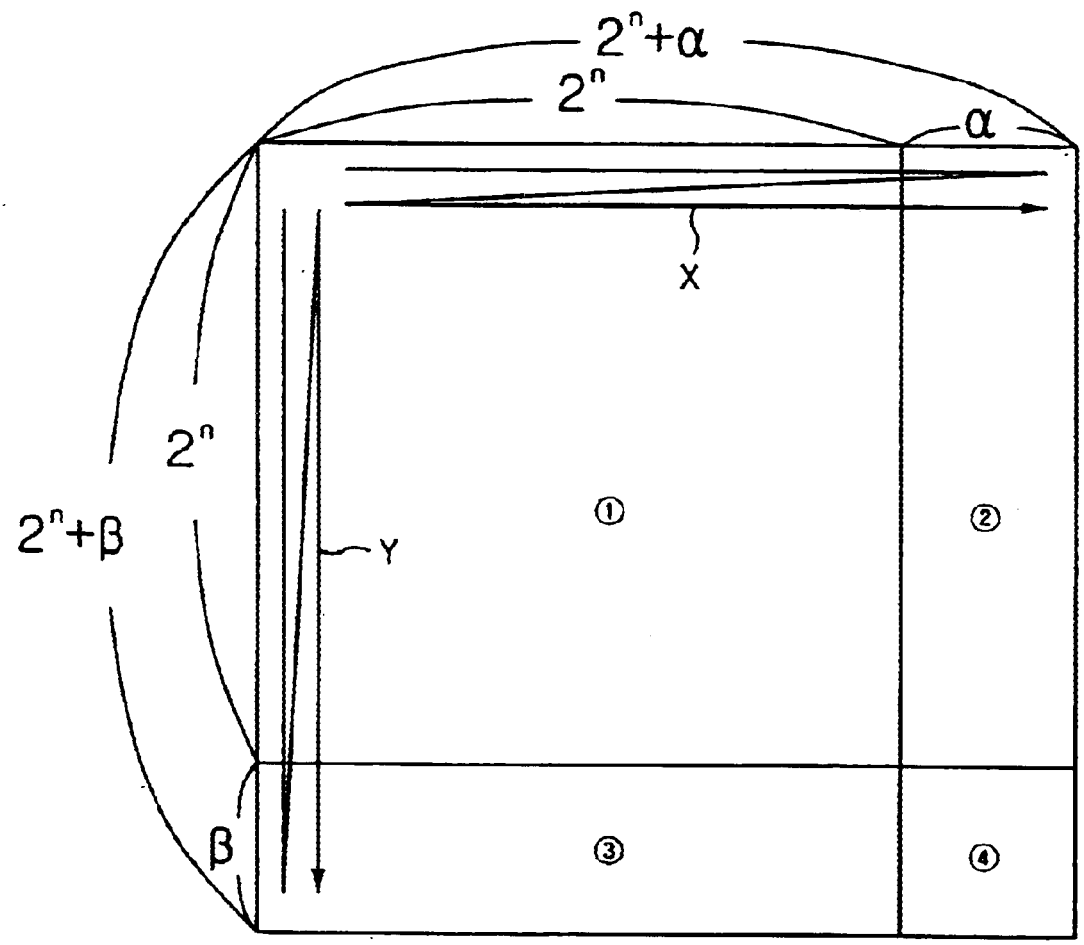
FIG. 8 is a diagram for illustrating memory blocks to describe an address generating method of a tester of the semiconductor memory device in accordance with the present invention.

Furthermore, a main cell array block ① in FIG. 8 and spare cell array blocks ②, ③, ④ in FIG. 8 may be separately tested. In this case, in order to test the main cell array block ①, the minimum and maximum values relevant to the main cell array block ① are specifically designated by the test program. On the other hand, in order to test spare cell array blocks ②, ③, ④, the minimum and maximum values relevant to the spare cell array blocks ②, ③, ④ are specifically designated by the test program.

Therefore, the tester of the semiconductor memory device of the present invention can generate accurate magnitude of the address range even in the case of an irregular capacity of the semiconductor memory device, i.e. in a case when the memory capacity is not a power of 2. For example, a memory device having $2^n+\alpha$ X addresses and $2^n+\beta$ Y addresses, as shown, may be tested, $\alpha$ and $\beta$ not being a power of 2 and even being different from one another.

In accordance with the aforementioned embodiment, row and column address generating circuits of the tester are described. However, the address generating method of the present invention may be applied in case of generating refresh addresses.

While the present invention has been described in detail with reference to the preferred embodiments, those skilled in the art will recognize that the invention can be practiced with modification or improvement within the spirit and scope of the appended claims.

There is an advantage in the tester of the semiconductor memory device of the present invention in that addresses can be accurately generated in response to any irregular capacity of the semiconductor memory device.

Therefore, there is another advantage in the tester of the semiconductor memory device of the present invention in that the user of the tester does not have to make a new test program, so providing convenience in performing a test and improving reliability in results of the test.

What is claimed is:

1. A test method of a tester of a semiconductor memory device which records a test pattern into the semiconductor memory device, reads the recorded test pattern to compare with an expected pattern, detects information on a defect of the semiconductor memory device resulted from the comparison and interprets the information on the defect of semiconductor memory device, the method comprising the steps of:
   presetting a minimum value and a maximum values relevant to a desired memory range of the semiconductor memory device, wherein the maximum value is not equal to 2 raised to the $n^{th}$ power, where n is a positive integer;
   incrementing a counted value from the minimum value to the maximum value;
   comparing the maximum value with the counted value;
   generating a carry signal when the maximum value and the counted value are the same; and
   resetting the counted value to the minimum value after the carry signal is generated.

2. The method of claim 1, wherein a capacity of the semiconductor memory device is a regular one that is completely defined as 2 raised to the $n^{th}$ power, where n is a positive integer.

3. The method of claim 1, wherein a capacity of the semiconductor memory device is an irregular one that can not be completely defined as 2 raised to the $n^{th}$ power, where n is a positive integer.

4. A tester for a semiconductor memory device having a test pattern generating means configured to generate an address of the semiconductor memory device and a test pattern relevant to the address;
- a comparison means configured to compare a desired value pattern generated by the test pattern generating means with data generated by the semiconductor memory device;
- a failure analysis memory for saving configured to save data produced by the comparison means; and
- a controlling means configured to control the test pattern generating means, the comparison means, and the failure analysis memory, the tester comprising:
  - a X-minimum registering means configured to save a minimum X-address;
  - a X-maximum registering means configured to save a maximum X-address, wherein the maximum X-address is not equal to 2 raised to the $n^{th}$ power, where n is a positive integer;
  - a Y-minimum registering means configured to save a minimum Y-address;
  - a Y-maximum registering means configured to save a maximum Y-address, wherein the maximum Y-address is not equal to 2 raised to the $n^{th}$ power, where n is a positive integer;
  - a X-address generator configured to output a plurality of X-addresses between the minimum X-address and the maximum X-address;
  - a Y-address generator configured to output a plurality of Y-addresses between the minimum Y-address and the maximum Y-address;
  - a X-carry signal generating means configured to output a X-carry signal if one of the plurality of X-addresses matches the maximum X-address, thereby resetting the X-address generator; and
  - a Y-carry signal generating means configured to output a Y-carry signal if one of the plurality of Y-addresses matches the maximum Y-address, thereby resetting the Y-address generator.

5. The tester of claim 4, wherein a capacity of the semiconductor memory device is a regular one that is completely defined as 2 raised to the $n^{th}$ power, where n is a positive integer.

6. The tester of claim 4, wherein a capacity of the semiconductor memory device is an irregular one that can not be completely defined as 2 raised to the $n^{th}$ power, where n is a positive integer.

7. The method of claim 4, wherein the X-carry signal generating means and the Y-carry signal generating means comprises:
- exclusive NOR-ing means configured to exclusively NOR a signals output from the respective X-address generator or Y-address generator with bit data from the respective X-maximum registering means or Y-maximum registering means; and
- an AND-ing means configured to AND signals output from the exclusive NOR-ing means.

8. A tester of a semiconductor memory device that records a test pattern into the semiconductor memory device, reads the recorded test pattern to compare with a desired value pattern, detects information on a defect of the semiconductor memory device resulting from the comparison, and interprets the information about the defect, the tester comprising:
- a first registering means configured to store a first X-location relevant to a selected area of the semiconductor memory device;
- a second registering means configured to store a second X-location relevant to the selected area, wherein an absolute value of the difference between the first and second X-locations is not equal to 2 raised to the $n^{th}$ power, n being a positive integer;
- a third registering means configured to store a first Y-location relevant to the selected area;
- a fourth registering means configured to store a second Y-location relevant to the selected area, wherein an absolute value of the difference between the first and second Y-locations is not equal to 2 raised to the $n^{th}$ power, n being a positive integer;
- a first address generating means configured to output a plurality of addresses starting with the first X-location and ending, at the second X-location;
- a second address generating means configured to output a plurality of addresses starting with the first Y-location and ending at the second Y-location;
- a first carry signal generating means configured to output a first carry signal if an address from the first address generator equals the second X-location and configured to reset the first address generator; and
- a second carry signal generating means configured to output a second carry signal if an address from the second address generator equals the second Y-location and configured to reset the second address generator.

9. The tester of claim 8, wherein the capacity of the semiconductor memory device to be tested is a regular one that can be specified using only a most significant bit of a multi-bit string.

10. The tester of claim 8, wherein the capacity of the semiconductor memory device is not a regular one that can be specified using only a most significant bit of a multi-bit string.

11. The tester of claim 8, wherein the first and second carry signal generating means comprises:
- a exclusive NOR-ing means configured to exclusively NOR signals output from the respective first or second address generating means with bit data from the respective second and fourth registering means; and
- an AND-ing means configured to AND signals output from the exclusive NOR-ing means.

12. A tester of a semiconductor memory device that records a test pattern into the semiconductor memory device, reads the test pattern and compares it with a desired value pattern, detects information on a defect of the semiconductor memory device resulting from the comparisons and interprets the information on the defect of the semiconductor memory device, the tester comprising:
- a minimum and a maximum address registering means configured to save a minimum and a maximum address values relevant to a selected test area of the semiconductor memory device, wherein the maximum address value is specified with a most significant bit and at least one other bit from a multi-bit string;
- an address counting means configured to count from the minimum address value to the maximum address value; and
- a carry signal generating means configured to output a carry signal, if an address output from the address counting means and the maximum address value are the same, thereby reseting the address counting means.

13. The tester of claim 12, wherein the capacity of the semiconductor memory device to be tested is a regular one that can be specified using only a most significant bit of a multi-bit string.

14. The tester of claim 12, wherein the capacity of the semiconductor memory device is not a regular one that can be specified using only a most significant bit of a multi-bit string.

15. The tester of claim 12, wherein the carry signal generating means comprises:
  an exclusive NORing means configured to exclusively NOR signals output from the address counting means and bit data from the maximum address values of the maximum address registering means; and
  ANDing means configured to AND signals output from the exclusive NORing means.

* * * * *

UNITED STATES PATENT AND TRADEMARK OFFICE
CERTIFICATE OF CORRECTION

PATENT NO. : 6,625,766 B1 Page 1 of 1
DATED : September 23, 2003
INVENTOR(S) : Oh et al.

It is certified that error appears in the above-identified patent and that said Letters Patent is hereby corrected as shown below:

Column 9,
Line 15, "memory for saving configured to save" should read -- memory configured to save --.
Line 57, "means comprises:" should read -- means comprise: --.
Line 59, "a signals output" should read -- a signal output --.

Column 10,
Line 21, "and ending. at" should read -- and ending at --.
Line 43, "means comprises:" should read -- means comprise: --.
Line 54, "the comparisons and" should read -- the comparison, and --.
Line 58, "address values relevant" should read -- address value relevant --.

Column 12,
Line 5, "address values of" should read -- address value of --.

Signed and Sealed this

Twenty-second Day of June, 2004

JON W. DUDAS
*Acting Director of the United States Patent and Trademark Office*